United States Patent
Wolf

(10) Patent No.: US 7,617,440 B2
(45) Date of Patent: Nov. 10, 2009

(54) VITERBI TRACEBACK INITIAL STATE INDEX INITIALIZATION FOR PARTIAL CASCADE PROCESSING

(75) Inventor: Tod D. Wolf, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 348 days.

(21) Appl. No.: 11/839,845

(22) Filed: Aug. 16, 2007

(65) Prior Publication Data

US 2009/0049367 A1 Feb. 19, 2009

(51) Int. Cl.
*H03M 13/03* (2006.01)
(52) U.S. Cl. .................. 714/795; 714/791; 714/792; 714/796; 375/262; 375/265; 375/341
(58) Field of Classification Search .................. 714/791, 714/792, 795, 796; 375/262, 265, 341
See application file for complete search history.

(56) References Cited

U.S. PATENT DOCUMENTS 6,690,750 B1 * 2/2004 Hocevar et al. .............. 375/341
2006/0256897 A1 * 11/2006 Wolf ........................... 375/341

* cited by examiner

*Primary Examiner*—Guy J Lamarre
*Assistant Examiner*—Sam Rizk
(74) *Attorney, Agent, or Firm*—Robert D. Marshall, Jr.; Wade J. Brady, III; Frederick J. Telecky, Jr.

(57) ABSTRACT

This invention provides the correct Viterbi decode traceback starting index is obtained for all constraint lengths and frame sizes. Reverse transpose operations that depend on the last active add-compare-select unit a cascade block of the state metric update process. This last active add-compare-select unit controls selection of T counter signals used in the decode.

3 Claims, 6 Drawing Sheets

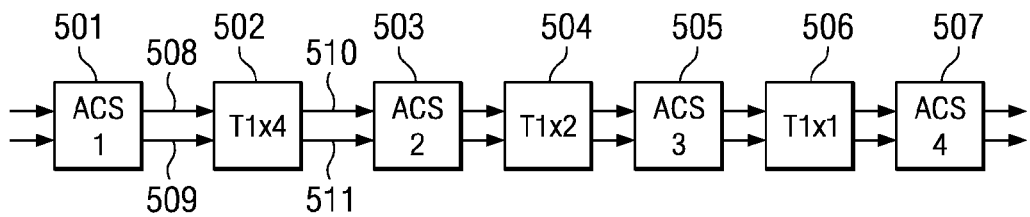
FIG. 5
*(PRIOR ART)*
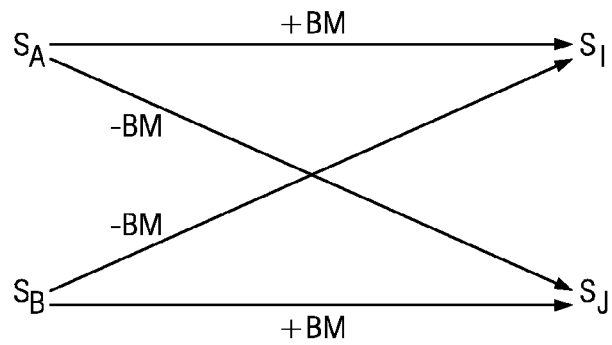
FIG. 6
*(PRIOR ART)*
FIG. 8A
*(PRIOR ART)*
FIG. 8B
*(PRIOR ART)*
FIG. 8C
*(PRIOR ART)*

VITERBI TRACEBACK INITIAL STATE INDEX INITIALIZATION FOR PARTIAL CASCADE PROCESSING

TECHNICAL FIELD OF THE INVENTION

The technical field of this invention is error correction in data transmission.

BACKGROUND OF THE INVENTION

Convolutional codes provide forward error correction for second and third generation wireless communications systems. Viterbi decoders are commonly used to decode the convolutionally coded information. The Viterbi decoding consists of two main stages: the state metric function; and the traceback function. State metric units based on a cascade architecture provide flexible computation when multiple constraint lengths and frame sizes are processed. Unfortunately this flexibility causes other difficulties when the cascade block contains a number of ACS units not an integer modulus of the cascade architecture.

Convolutional coding is a bit-level encoding technique rather than block-level techniques such as Reed-Solomon coding. One of the chief advantages of convolutional codes over block-level codes is that convolutional codes may be decoded after an arbitrary length of data, while block-level codes introduce latency by requiring reception of an entire data block before decoding. Thus convolutional codes do not require block synchronization.

Convolutional codes are decoded by using the familiar trellis diagram to find the most likely sequence of codes. The Viterbi algorithm (VA) simplifies the decoding task by limiting the number of sequences examined. The most likely path to each state is retained for each new symbol.

Most digital signal processors (DSP) used in Viterbi decoding incorporate a special hardware unit to accelerate Viterbi metric-update computation called an add-compare-select-store unit. Such an add-compare-select-store unit with dual accumulators and a splittable ALU performs a Viterbi butterfly computation in four cycles.

Convolutional encoder error-correction capabilities use the fact that current code symbol outputs depend on past information bit values. Each coded bit is generated by convolving the input bit with previous uncoded bits. FIG. 1 illustrates an example of this process. The information bits 100 are input to a shift register with taps at various points 101, 102, 103 and 104. The tap values are combined through Boolean XORs 105 and 106. XORs 105 and 106 generate a high output if one and only one input is high. The output of XOR 105 produces code symbol output 107 and the output of XOR 106 produces code symbol output 108.

Error correction is dependent on a number of past samples forming the code symbols. The number of input bits used in the encoding process is the constraint length k. This constraint length is calculated as the number of unit delays plus one in the code generation circuit, such as FIG. 1.

FIG. 1 includes four delays. The constraint length k is thus five. The constraint length represents the total span of values used and is determined independent of the number of taps used to form the code words. The constraint length implies many system properties. Most importantly, the constraint length indicates the number of possible delay states.

Another major factor influencing error correction is the coding rate, the ratio of input data bits to bits transmitted. In the circuit of FIG. 1, two bits are transmitted for each input bit for a coding rate of 1/2. In a circuit having a coding rate of 1/3 includes one more XOR producing one more output for every input bit. Although any coding rate is possible, rate 1/n systems are most widely used due to the efficiency of the decoding process.

Convolutionally encoded data is decoded through knowledge of the possible state transitions, created from the dependence of the current symbol on past information bit data. The familiar trellis diagram having an appropriate number of delay states represents the allowable state transitions for a set of coding parameters.

FIG. 2 illustrates a simple example trellis diagram for a constraint length k=3 and a 1/2-rate encoder. The delay states represent the state of the encoder (the actual bits in the encoder shift register at nodes 101 through 104), while the path states represent the symbols that are output from the encoder (one pair of symbols from the pair of outputs 107 and 108). Each column of delay states indicates (distance between 201 and 202 for example) one symbol interval.

The number of delay states is determined by the constraint length. In this example, the constraint length is three and the number of possible states is $2^{k-1}=2^2=4$. Knowledge of the delay states is very useful in data decoding, but the path states are the actual encoded and transmitted values. In the example of FIG. 2, the delay states are labeled 201, 202, 203 and 204.

The number of bits representing the path states (210 and 211) is a function of the coding rate. In this example, two output bits are generated for every input bit, resulting in 2-bit path states. A rate 1/3 (or 2/3) encoder has 3-bit path states, a rate 1/4 has 4-bit path states, and so forth. Since path states represent the actual transmitted values, they correspond to points on a constellation diagram that describes the specific magnitude and phase values used by the modulator.

The decoding process estimates the delay state sequence, based on received data symbols, to reconstruct a path through the trellis. The delay states 201 through 204 directly represent encoded data, since the states correspond to bits in the encoder shift register. Path states 210 and 211 represent the path bits intermediate to the delay states.

In the circuit of FIG. 2, the most significant bit (MSB) of the delay states corresponds to the most recent input and the least significant bit (LSB) corresponds to the previous input. Each input shifts the path state value one bit to the right, with the new bit shifting into the MSB position. For example, if the current path state is 00 and a 1 is input, the next path state is 10; a 0 input produces a next path state of 00.

Systems of all constraint lengths use similar state mapping. The correspondence between data values and states allows straightforward data reconstruction once the path through the trellis is determined.

FIG. 3 is a high level block diagram illustrating convolutional encoder 301, transmission path 302, and Viterbi decoder 303. Convolutional encoder 301 (such as the example illustrated in FIG. 1) produces a stream p(x) 304 of f by R symbol elements transmitted through transmission path 302, where f is the frame length under consideration and R is the number of bits per symbol. Transmission path 302 introduces errors e(x) 311 with the resulting stream r(x) 305 having f by R corrupted symbol elements. Viterbi decoder 303 receives this input stream and passes the symbols to the branch metrics unit 308 for comparison with known branch metrics stored in decoder RAM 315. The branch metrics unit output 306 is a stream of metrics to be processed by the state metric update 309 to identify the most likely path through the trellis for stream 305. Traceback unit 310 completes processing by identifying the total path through the trellis and producing output 312. This output is the decoder output i(x) for the frame f.

Viterbi Algorithm (VA) minimizes the number of data-symbol sequences represented by trellis paths. As a maximum-likelihood decoder, the VA identifies the code sequence with the highest probability of matching the transmitted sequence based on the received sequence.

The VA code is implemented by three stage decoder unit 303. Decoder unit 303 is driven by the decoder control unit 314 and stores data in decoder RAM 315. The datapath of decoder unit 303 includes branch metrics unit 308, state metric update unit 309 and traceback unit 310. In state metric update unit 309, probabilities are accumulated for all states based on the current input symbol. The traceback routine reconstructs the data once a unique path through the trellis is identified.

FIG. 4 illustrates a brief psuedo-code sequence of the major steps for the VA in flow chart form. For each Frame:

```
{
    401: Initialize metrics for each symbol:
    {
    400: Metric Update or Add-Compare-Select (ACS)
    For each delay state:
        {
        402: Calculate local distance of input to each possible path
        403: Accumulate total distance for each path
        404: Select and save minimum distance
        405: Save indication of path taken
        406: complete metric update
        }
    }
    410: Traceback
    411: Initialize Traceback
    for each bit in a frame (or for minimum # bits)
        {
        412: Calculate position in transition data of the current
        state
        413: Read selected bit corresponding to state
        414: Update state value with new bit
        }
    415: reverse output bit ordering
    416: complete traceback.
}
```

Although one delay state is entered for each symbol transmitted, the VA calculates the most likely previous delay state for all possible states, since the actual encoder state is not known until a number of symbols are received. Each delay state is linked to the previous delay states by a subset of all possible paths. For rate 1/n encoders, there are only two paths from each delay state. This considerably limits the calculations.

FIG. 4 illustrates beginning by initializing the Metric Update metric paths for each symbol. These path states are then estimated by combining the current input value r(x) 305 and the accumulated metrics of previous states stored in decoder RAM 315. Each path has an associated symbol or constellation point. The local distance to that symbol from the current input is calculated in block 402. For a better estimation of data validity, the local distance is added to the accumulated distances of the state to which the path points in block 403.

Because each delay state has two or more possible input paths, the accumulated distance is calculated for each input path. The path with the minimum accumulated distance is selected as the survivor path and saved in block 404. This selection of the most probable sequence is key to VA efficiency. By discarding most paths, the number of possible paths stored is minimized.

An indication of the path and the previous delay state is stored in block 405 to enable reconstruction of the state sequence from a later point. The minimum accumulated distance is stored for use in the next symbol period. This completes the metric update of block 406 that is repeated for each state. The metric update is also called the add-compare-select (ACS) operation: accumulation of distance data; comparison of input paths; and selection of the maximum likelihood path.

In the metric update, data is stored for each symbol interval indicating the path to the previous state. A value of 1 in any bit position indicates that the previous state is the lower path, and a 0 indicates the previous state is the upper path. Each prior state is constructed by shifting the transition value into the LSB of the state. This is repeated for each symbol interval until the entire sequence of states is reconstructed. Since these delay states directly represent the actual outputs, it is a simple matter to reconstruct the original data from the sequence of states. In most cases, the output bits must be reverse ordered, since the traceback works from the end to the beginning.

FIG. 5 illustrates a prior art state metric unit designed using cascade architecture. The cascade unit is designed to support trellis sizes from 16 to 256 states or a constraint length k from 5 to 9. This unit performs four add-compare-select (ACS) operations 501, 503, 505 and 507, and three transpose operations (Tn×m) 502, 504 and 506. Each block receives two state metric inputs, for example input 508 and 509 to transpose block 502, and generates two state metrics, for example outputs 510 and 511 from transpose block 502. Each ACS unit calculates the state metrics for one trellis delay stage. Therefore, the four ACS units for FIG. 5 calculate the state metrics for four consecutive trellis delay stages.

This architecture supports radix 16 trellises. For trellis sizes 16 and 256 the architecture can be fully pipelined. For other trellis size, the units are not 100% utilized and holes are introduced in the pipeline. The holes are introduced by turning various blocks OFF. The activation of each of the units is illustrated in Table 1. The ON label indicates the functional block is performing as desired. The OFF label indicates the functional block is only passing data. The pipelining remains constant and is not affected by the blocks activation level.

TABLE 1

| Number of states | Pass number | ACS1 | T1x4 | ACS2 | T1x2 | ACS3 | T1x1 | ACS4 |
|---|---|---|---|---|---|---|---|---|
| 256 | 1 | ON | ON | ON | ON | ON | ON | ON |
| 256 | 2 | ON | ON | ON | ON | ON | ON | ON |
| 128 | 1 | ON | ON | ON | ON | ON | ON | ON |
| 128 | 2 | OFF | OFF | ON | ON | ON | ON | ON |
| 64 | 1 | ON | ON | ON | ON | ON | ON | ON |
| 64 | 2 | OFF | OFF | OFF | OFF | ON | ON | ON |
| 32 | 1 | ON | ON | ON | ON | ON | ON | ON |
| 32 | 2 | OFF | OFF | OFF | OFF | OFF | OFF | ON |
| 16 | 1 | ON | ON | ON | ON | ON | ON | ON |

FIG. 6 illustrates pictorially the combinations of butterfly calculations performed by the ACS units. The equations for the ACS unit butterfly for computation of state metrics are:

$$S_I = \max(S_A + BM, S_B - BM) \quad (1)$$

$$S_J = \max(S_A - BM, S_B + BM) \quad (2)$$

where: $S_I$ and $S_J$ are respective output metrics; $S_A$ and $S_B$ are respective input metrics: and BM is the metric specific to a particular butterfly.

The ACS will also generate two decision bits for both equations:

$$D_I = 0 \text{ when } (S_A + BM) > (S_B - BM) \quad (3)$$

Otherwise $D_I = 1$, and $$D_J = 0 \text{ when } (S_A - BM) > (S_B + BM) \quad (4)$$

Otherwise $D_J = 1$.

FIG. 7 illustrates a block diagram of a transpose 1 by 4 unit 7 for the state metric unit. Blocks 701, 702, 703 and 704 are delay elements. Delay elements 703 and 704 are required for timing. Two states $S_I$ and $S_J$ enter this block and two states $S_K$ and $S_L$ exit during every clock cycle. The block performs a 1 by 4 transpose of the states. The crossbar block 706 controls the flow of the states. If control input 786 is low, then the states are allowed to pass directly to the other side. Conversely if control input 786 is high, then the states cross over from the bottom rail to the top rail. Crossbar block 706 has a three stage pipeline. States 0 and 1 enter the block during the first cycle; states 8 and 9 enter the block during the second cycle. States 0 and 8 are output after two cycles; states 1 and 9 are output after the third cycle. FIG. 8 illustrates examples of the transpose operations performed by crossbar block 706 using matrix equations.

The output of the cascade block of FIG. 5 is a vector of state metrics that are output two states at a time. These two states are t1 and b1. Table 2 shows the order of the states at the input of ACS1 block 501 and at the outputs of the other blocks of FIG. 5 for a constraint length of 5. For each entry in Table 2, t1 is the first listed integer and b1 is the second listed integer. There are 16 states for k=5 and the states are broken down into an 8 by 2 matrix. The first column illustrates the state metric indices for the inputs to ACS1 501 and is labeled with an I. The other columns illustrate the state metric indices for the outputs of all the other units and are labeled with an O. Similar Tables can be generated for constraint lengths of 6 through 9.

of symbols equal to about four or five times the constraint length, little accuracy is gained by additional inputs.

The traceback function starts from a final state that is either known or estimated to be correct. After four or five iterations of traceback, the constraint length, the state with the minimum accumulated distance can be used to initiate final traceback. A more exact method is to wait until an entire frame of data is received before beginning traceback. In this case, tail bits are added to force the trellis to the zero state, providing a known point to begin traceback.

SUMMARY OF THE INVENTION

This invention provides techniques for modification of cascade architectures in Viterbi decoders allowing for proper initialization of the traceback function. While the cascade architecture provides flexible computation when multiple constraint lengths and frame sizes are processed, other difficulties arise when the cascade is not an integer modulus of the cascade architecture. This invention provides the correct traceback starting index for all constraint lengths and frame sizes. Reverse transpose operations that depend on the ending ACS unit are used to generate the correct index. A state counter is employed and the counter bits are rotated and multiplexed to provide the correct starting index. This results in a successful traceback operation and an optimized bit error rate (BER) for any processing scenario.

BRIEF DESCRIPTION OF THE DRAWINGS

These and other aspects of this invention are illustrated in the drawings, in which:

FIG. 5 illustrates the state metric unit portion of a Viterbi decoder designed with a cascade architecture (Prior Art);

FIG. 6 illustrates the pictorial diagram of the butterfly computation employed in the add-compare-select operations of the ACS unit (Prior Art);

TABLE 2

| ACS1_I 501 | ACS1_O 501 | T1x4_O 502 | ACS2_O 503 | T1x2_O 504 | ACS3_O 505 | T1x1_O 506 | ACS4_O 507 |
|---|---|---|---|---|---|---|---|
| 0, 8 | 0, 1 | 0, 8 | 0, 1 | 0, 8 | 0, 1 | 0, 8 | 0, 1 |
| 1, 9 | 2, 3 | 2, 10 | 4, 5 | 4, 12 | 8, 9 | 1, 9 | 2, 3 |
| 2, 10 | 4, 5 | 4, 12 | 8, 9 | 1, 9 | 2, 3 | 2, 10 | 4, 5 |
| 3, 11 | 6, 7 | 6, 14 | 12, 13 | 5, 13 | 10, 11 | 3, 11 | 6, 7 |
| 4, 12 | 8, 9 | 1, 9 | 2, 3 | 2, 10 | 4, 5 | 4, 12 | 8, 9 |
| 5, 13 | 10, 11 | 3, 11 | 6, 7 | 6, 14 | 12, 13 | 5, 13 | 10, 11 |
| 6, 14 | 12, 13 | 5, 13 | 10, 11 | 3, 11 | 6, 7 | 6, 14 | 12, 13 |
| 7, 15 | 14, 15 | 7, 15 | 14, 15 | 7, 15 | 14, 15 | 7, 15 | 14, 15 |

Figure 1:
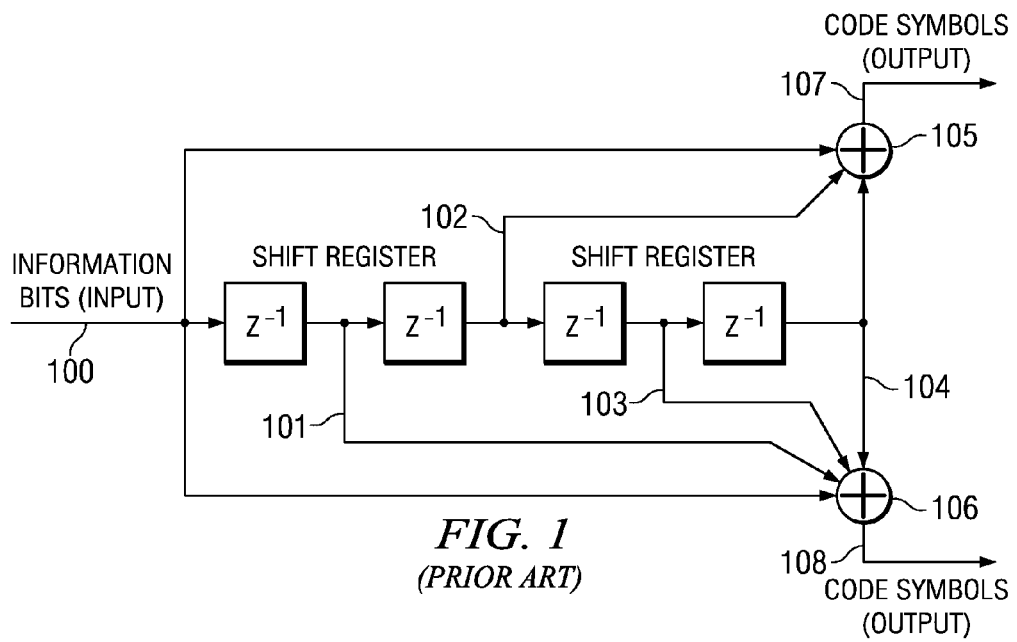
FIG. 1 illustrates the block diagram of a rate 1/2 convolutional encoder having a constraint length of 5 (Prior Art)
Figure 2:
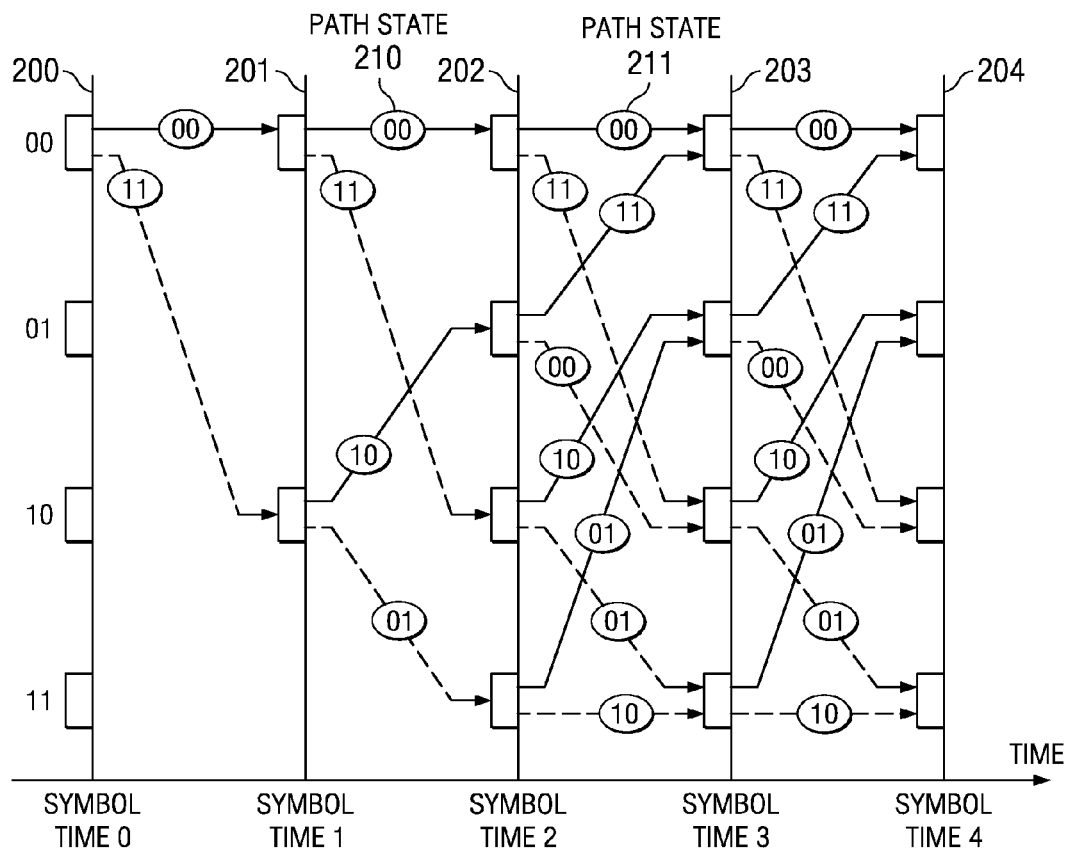
FIG. 2 illustrates a trellis diagram for a rate 1/2 convolutional encoder having a constraint length of 3 (Prior Art)
Figure 3:
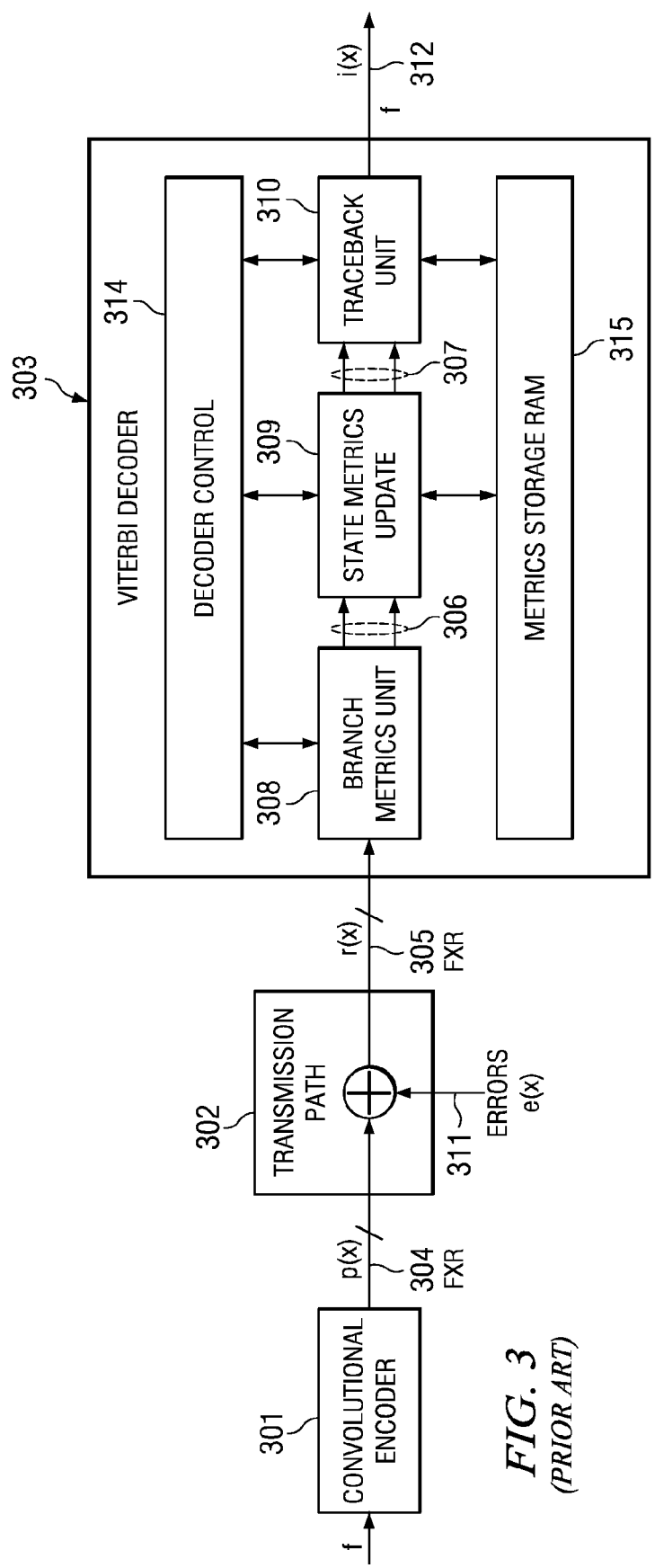
FIG. 3 illustrates the block diagram of a convolutional encoder, a transmission path introducing errors and a Viterbi decoder converting received symbols to a corrected stream of data (Prior Art)
Figure 4:
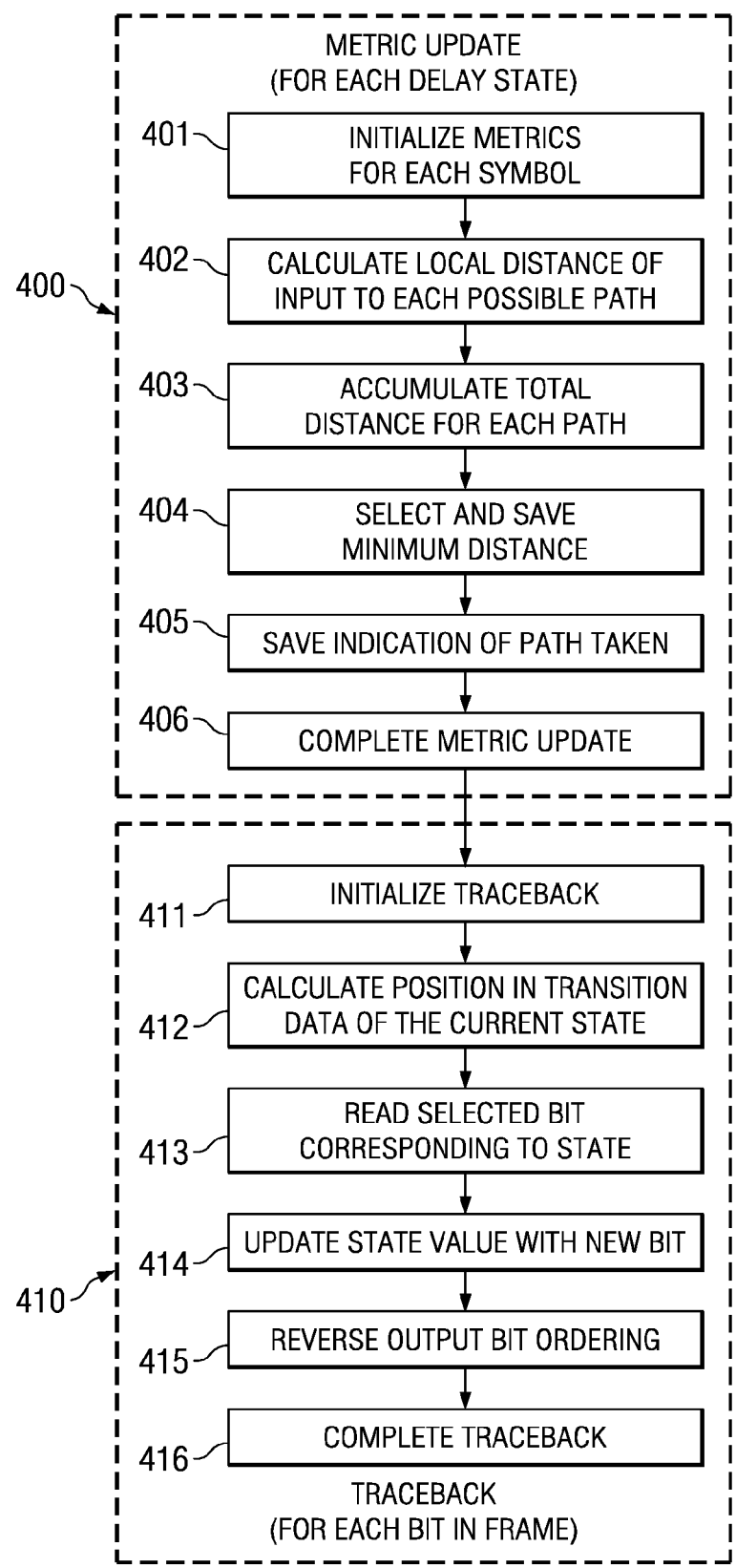
FIG. 4 illustrates the code sequences for the Viterbi decoder metric update and traceback computations (Prior Art)
Figure 7:
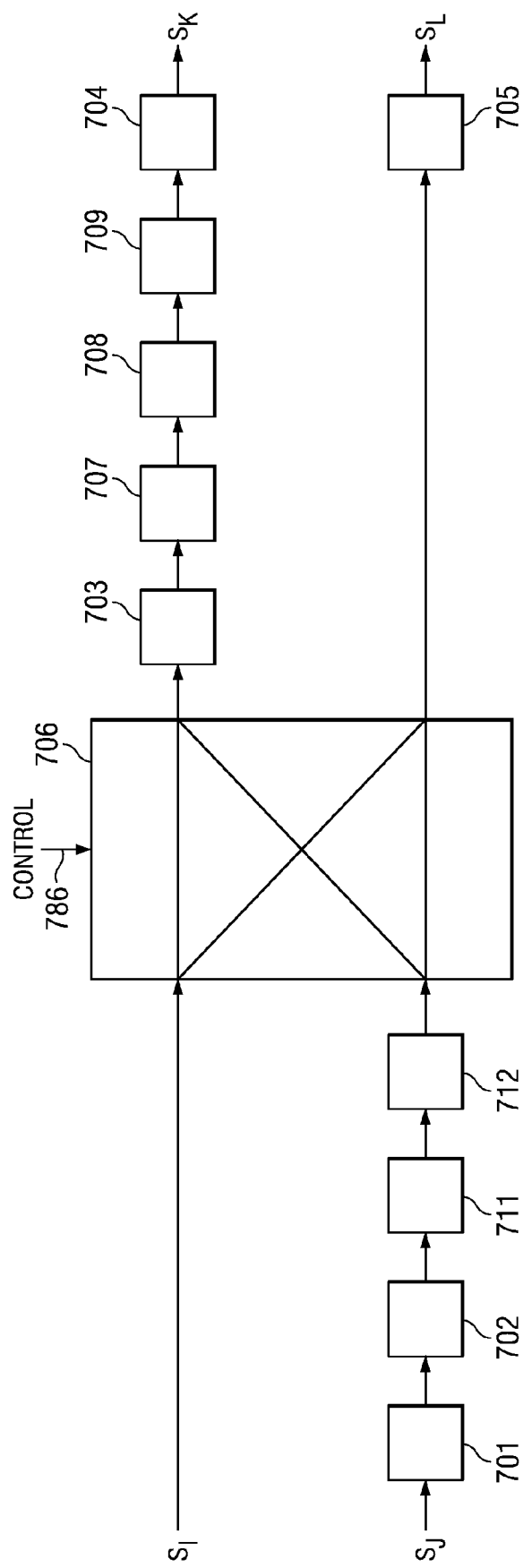
Figure 9:
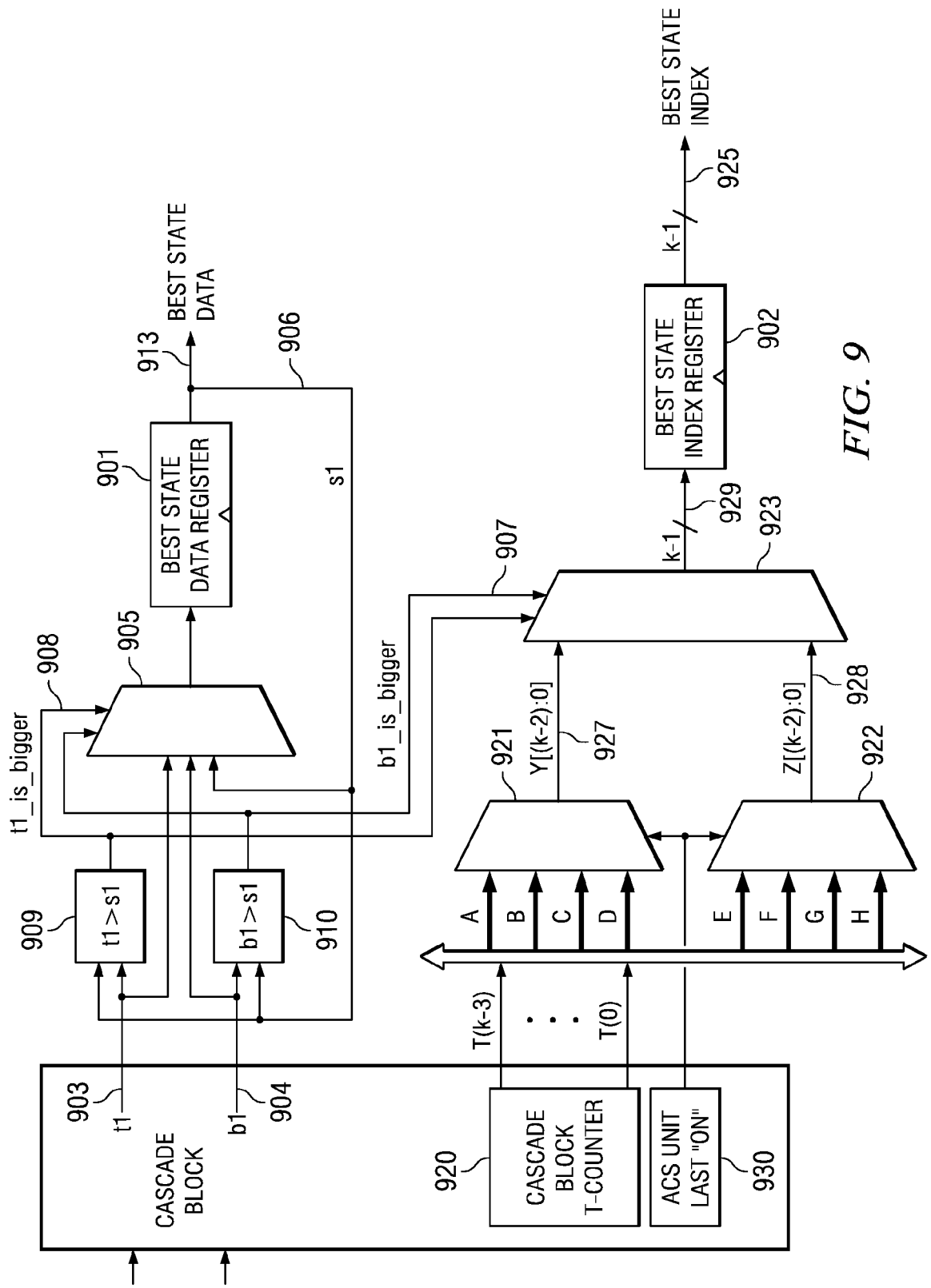

The actual decoding of symbols into the original data is accomplished by tracing the maximum likelihood path backwards through the trellis. Generally, a longer sequence results in a more accurate reconstruction of the trellis. After a number FIG. 7 illustrates the functional diagram of a 1 by 4 transpose unit (Prior Art);

FIG. 8 illustrates the matrix transformations for transpose 1 by 1, 1 by 2, and 1 by 4 (Prior Art); and FIG. 9 illustrates in block diagram form the hardware used to compute the best state index in a the traceback unit of the Viterbi decoder of this invention.

DETAILED DESCRIPTION OF PREFERRED EMBODIMENTS

The present invention is concerned chiefly with the second part of the Viterbi decoder, the traceback unit and its initialization. The traceback unit traverses the trellis backwards using the decision bits that were generated by the state metric unit. The Viterbi decoder successfully generates an optimum bit error rate (BER) for a specific application scenario only when the traceback unit is initialized with the correct starting index of the last processed trellis. In modes where the state metric unit ends in the 0 state the traceback unit can be forced to start in the 0 state, satisfying this initialization requirement.

In the convergent mode, however, the state metric unit ends in some other terminal state. The index of this terminal state should be used as the initialized traceback state. The index for this state can be found by finding the best state for the last trellis section generated by the state metric unit. The best state is the state that has the largest value. The index of this best state is then used as the starting state in the traceback unit.

FIG. 9 illustrates a circuit of this invention which finds the best state with highest value and the index of the best state. At reset the best state data register 901 and best state index register 902 are both set to 0. The output of the cascade block is a vector of state metrics that are output two states at a time. These are t1 903 and b1 904. The order of the states is given in the ACS4_O column of Table 2 for a length of 5. Similar tables exist and can be stored in memory for other constraint lengths up to 9. In the Table entries 2 t1 is the first listed integer and b1 is the second listed integer of each pair of numbers. The two output states t1 and b1 are compared in comparators 909 and 910 with the best state data register 901 via feedback path 906.

If either is larger than the stored best state, then the corresponding comparator signal 907 or 908 is used to control the multiplexer 905. Multiplexer 905 selects a new best state data 913 to be stored in best state data register 901.

Computation of the best state index 925 in the lower portion of FIG. 9 is considerably simpler in modes wherein the state metric unit ends in the 0 state. The traceback unit can be forced to start in the 0 state, satisfying the initialization requirement. As a crucial part of the present invention, this lower portion of the circuit is considerably enhanced to generate the correct best state index for all modes including the convergent mode wherein the state metric unit ends in some other terminal state.

The cascade block T-counter 920 counts from the beginning to the end of each set of cascaded outputs. Outputs from this counter 920 are used in various combinations to drive multiplexers 921 and 922 based on respective Tables 7 and 8.

Cascade block T-counter 920 counts from 0 to $2^{k-2}-1$. If k=5, then cascade block T-counter 920 counts from 0 to 7. The counter bits are labeled T[(k-3):0]. These counter outputs are used in combinations of k−1 bits to form the inputs A, B, C and D to multiplexer 921 and the inputs E, F, G and H to multiplexer 922.

If the frame length f plus convergent length c (f+c) ends with ACS4 507 active, or stated another way if f+c=x and x modulo(k−1) end with the ACS4 507 unit active, then the circuit could be simplified. ACS4 507 is active when it is ON as shown in Tables 3 and 4 for k=5 and k=6, respectively.

TABLE 3

| Pass number | x % 4 | ACS1 501 | T1x4 502 | ACS2 503 | T1x2 504 | ACS3 505 | T1x1 506 | ACS4 507 |
|---|---|---|---|---|---|---|---|---|
| 1 | 0 | ON | ON | ON | ON | ON | ON | ON |
| 1 | 3 | ON | ON | ON | ON | ON | ON | OFF |
| 1 | 2 | ON | ON | ON | ON | OFF | ON | OFF |
| 1 | 1 | ON | ON | OFF | ON | OFF | ON | OFF |

TABLE 4

| Pass number | x % 5 | ACS1 501 | T1x4 502 | ACS2 503 | T1x2 504 | ACS3 505 | T1x1 506 | ACS4 507 |
|---|---|---|---|---|---|---|---|---|
| 1 | 4 | ON | ON | ON | ON | ON | ON | ON |
| 1 | 3 | ON | ON | ON | ON | ON | ON | OFF |
| 1 | 2 | ON | ON | ON | ON | OFF | ON | OFF |
| 1 | 1 | ON | ON | OFF | ON | OFF | ON | OFF |
| 2 | 0 | OFF | OFF | OFF | OFF | OFF | OFF | ON |

If the last trellis stage active was ACS1 501, ACS2 503 or ACS3 505 and not ACS4 507, then the index for the last processed trellis stage is not in the order listed in Table 2. Therefore, the circuit in FIG. 9 requires the additional complexity included in multiplexers 921, 922 and 923 to find the correct index for that last trellis stage.

For k=5, Table 5 lists the four cascaded state ordering possibilities for various last ending trellis stages. Each column notes the last active ACS unit. The ordering of the states is different in each column.

TABLE 5

| Counter | x % 4 = 0 or ACS4 | x % 4 = 3 or ACS3 | x % 4 = 2 or ACS2 | x % 4 = 0 or ACS1 |
|---|---|---|---|---|
| 0 | 0, 1 | 0, 8 | 0, 4 | 0, 2 |
| 1 | 2, 3 | 1, 9 | 8, 12 | 4, 6 |
| 2 | 4, 5 | 2, 10 | 1, 5 | 8, 10 |
| 3 | 6, 7 | 3, 11 | 9, 13 | 12, 14 |
| 4 | 8, 9 | 4, 12 | 2, 6 | 1, 3 |
| 5 | 10, 11 | 5, 13 | 10, 14 | 5, 7 |
| 6 | 12, 13 | 6, 14 | 3, 7 | 9, 11 |
| 7 | 14, 15 | 7, 15 | 11, 15 | 13, 15 |

To find the correct best state index when f+c does not end with ACS4 active requires the ability to reverse the state transitions of the transpose logic. The expected sequence of states is illustrated in Table 5 depending on which ACS is the last ACS that is activated. Table 6 shows a portion of same data listed in Table 5 listed in binary notation instead of decimal notation. Note that the states for t1 and b1 are rotated one bit for each new column. Thus t1 progresses from 0110 to 0011 to 1001 to 1100 and b1 progresses from 0111 to 1011 to 1101 to 1110 for counter equals 3.

TABLE 6

| Counter | x % 4 = 0 or ASC4 | x % 4 = 3 or ASC3 | x % 4 = 2 or ASC2 | x % 4 = 0 or ASC1 |
|---|---|---|---|---|
| 3 | 0110, 0111 | 0011, 1011 | 1001, 1101 | 1100, 1110 |
| 4 | 1000, 1001 | 0100, 1100 | 0010, 0110 | 0001, 0011 |

This rotation is valid for all rows in Table 5, and the rotation is valid for all constraint lengths. To implement the rotation on the calculated indices two multiplexers 921 and 922 are required to fulfill the best state index logic requirement as illustrated in FIG. 9.

Table 7 shows the detailed inputs and outputs for multiplexer 921, the t1 portion of the circuit. Table 8 shows the detailed inputs and outputs for multiplexer 922, the b1 portion of the circuit. The inputs to these multiplexers are shifted versions of the counter bits depending on the last ACS processed in the cascade architecture. Tables 7 and 8 show the input/output values for multiplexers 921 and 922 respectively in terms of k on the left side and for k=5 on the right side.

The BER of the Viterbi decoder will be degraded if the traceback starting point is not correctly initialized. In the state metric unit designed with a cascade architecture, solving for the correct index of the best state is difficult due to the unused ACSs at the trailing end of the cascade. Solving the problem of finding the correct state index will led to a higher performing Viterbi decoder.

TABLE 7

| Inputs | Outputs | | Inputs for k = 5 | Outputs for k = 5 | |
|---|---|---|---|---|---|
| A[(k − 2):0] T[k − k + 1] T[k − k] 0 ... T[k − k + 2] | Y[k − 2] Y[k − 1] Y[k] ... Y[0] | If ACS1 ON | T[1] T[0] 0 ... T[2] | Y[3] Y[2] Y[1] Y[0] | A |
| B[(k − 2):0] T[k − k] 0 T[k − 3] ... T[k − k + 1] | Y[k − 2] Y[k − 1] Y[k] ... Y[0] | If ACS2 ON | T[0] 0 T[2] T[1] | Y[3] Y[2] Y[1] Y[0] | B |
| C[(k − 2):0] 0 T[k − 3] T[k − 4] ... T[k − k] | Y[k − 2] Y[k − 1] Y[k] ... Y[0] | If ACS3 ON | 0 T[2] T[1] T[0] | Y[3] Y[2] Y[1] Y[0] | C |
| D[(k − 2):0] T[k − 3] T[k − 4] T[k − 5] ... 0 | Y[k − 2] Y[k − 1] Y[k] ... Y[0] | If ACS4 ON | T[2] T[1] T[0] 0 | Y[3] Y[2] Y[1] Y[0] | D |

TABLE 8

| Inputs | Outputs | | Inputs for k = 5 | Output for k = 5 | |
|---|---|---|---|---|---|
| E[(k − 2):0] T[k − k + 1] T[k − k] 1 ... T[k − k + 2] | Z[k − 2] Z[k − 1] Z[k] ... Z[0] | If ACS1 ON | T[1] T[0] 1 ... T[2] | Z[3] Z[2] Z[1] Z[0] | E |
| F[(k − 2):0] T[k − k] 1 T[k − 3] ... T[k − k + 1] | Z[k − 2] Z[k − 1] Z[k] ... Z[0] | If ACS2 ON | T[0] 1 T[2] T[1] | Z[3] Z[2] Z[1] Z[0] | F |
| G[(k − 2):0] 1 T[k − 3] T[k − 4] ... T[k − k] | Z[k − 2] Z[k − 1] Z[k] ... Z[0] | If ACS3 ON | 1 T[2] T[1] T[0] | Z[3] Z[2] Z[1] Z[0] | G |
| H[(k − 2):0] T[k − 3] T[k − 4] T[k − 5] ... 1 | Z[k − 2] Z[k − 1] Z[k] ... Z[0] | If ACS4 ON | T[2] T[1] T[0] 1 | Z[3] Z[2] Z[1] Z[0] | H |

What is claimed is:

1. A Viterbi decoder comprising:

a cascade block including serially connected add-compare-select unit and transpose units that outputs two state metrics at a time, a cascade block T counter generating a plurality of counter signals that count sets of cascade outputs from 0 to $2^{k-2}-1$, where k is a constraint length and outputting an indication of a last active add-compare-select unit based upon the constraint length k;

a best state register storing and outputting a best state value;

a first comparator comparing a first state metric with the best state value generating a first comparison signal if the first state metric is greater than the best state value;

a second comparator comparing a second state metric with the best state register value generating a second comparison signal if the second state metric is greater than the best state value;

a first multiplexer having a first input receiving the first state metric, a second input receiving the second state metric, a third input receiving the best state value signals, a first control input receiving the first comparison signal, a second control input receiving the second comparison signal and an output supplying a selected one of the first state metric, the second state metric of the best state value dependent upon the state of the first comparison signal and the state of the second comparison signal;

a second multiplexer having a number of inputs equal to twice a number of add-compare-select units in said cascade unit each receiving k−1 combinations of T counter signals, having a first input receiving said indication of a last active add-compare-select unit, a second control input receiving the first comparison signal, a third control input receiving the second comparison signal and an output supplying a selected one of said k−1 combinations of T counter signals dependent upon said indication of a last active add-compare-select unit, the state of the first comparison signal and the state of the second comparison signal; and a best state index register having an input connected to said output of said second multiplexer for storing one of said k−1 combinations of T counter signals.

2. The Viterbi decoder of claim 1, wherein:

said second multiplexer includes a third multiplexer having the number of add-compare-select units in said cascade block input each receiving a unique ordering of 0 and k−2 T counter signals, a first input receiving said indication of a last active add-compare-select unit and an output supplying a ordering of T counter signals corresponding to a last active add-compare-select unit, a fourth multiplexer having the number of add-compare-select units in said cascade block input each receiving a unique ordering of 1 and k−2 T counter signals, a first input receiving said indication of a last active add-compare-select unit and an output supplying a ordering of T counter signals corresponding to a last active add-compare-select unit, and a fifth multiplexer having a first input receiving said output of said third multiplexer, a second input receiving said output of said fourth multiplexer, a first control input receiving the first comparison signal, a second control input receiving the second comparison signal and an output supplying a selected one of the output of the third multiplexer or the output of the fourth multiplexer dependent upon the state of the first comparison signal and the state of the second comparison signal.

3. The Viterbi decoder of claim 2, wherein:

said cascade block includes 4 add-compare-select units;

said unique ordering of 0 and k−2 T counter signals consists of (0, T[0] to T[k−3]) for a last active add-compare-select unit, (T[0] to T[k−3], 0) for a next to last active add-compare-select unit, (T[1] to T[k−3], 0, T[0]) for a second to last active add-compare-select unit and (T[2] to T[k−3], 0, T[0], T[1]) for a third to last active add-select compare unit; and said unique ordering of 1 and k−2 T counter signals consists of (1, T[0] to T[k−3]) for a last active add-compare-select unit, (T[0] to T[k−3], 1) for a next to last active add-compare-select unit, (T[1] to T[k−3], 1, T[0]) for a second to last active add-compare-select unit and (T[2] to T[k−3], 1, T[0], T[1]) for a third to last active add-select compare unit.

* * * * *